(12) United States Patent
Lou et al.

(10) Patent No.: US 8,531,876 B2
(45) Date of Patent: Sep. 10, 2013

(54) UNIPOLAR SPIN-TRANSFER SWITCHING MEMORY UNIT

(75) Inventors: Xiaohua Lou, Bloomington, MN (US); Haiwen Xi, Prior Lake, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 13/527,839

(22) Filed: Jun. 20, 2012

(65) Prior Publication Data

US 2012/0257446 A1    Oct. 11, 2012

Related U.S. Application Data

(62) Division of application No. 12/175,545, filed on Jul. 18, 2008, now Pat. No. 8,233,319.

(51) Int. Cl.
*G11C 11/14*    (2006.01)

(52) U.S. Cl.
USPC ........... 365/171; 365/148; 365/158; 977/933; 977/935

(58) Field of Classification Search
USPC ................ 365/48, 55, 62, 66, 74, 78, 80–93, 365/100, 130, 131, 148, 158, 171–173, 209, 365/213, 225.5, 230.07, 232, 243.5; 216/22; 257/421, E21.665; 438/3; 428/810–816, 428/817–825.1, 826; 977/933–935
See application file for complete search history.

(56) References Cited

U.S. PATENT DOCUMENTS

| | | | |
|---|---|---|---|
| 5,640,343 A | 6/1997 | Gallagher | |
| 5,695,864 A | 12/1997 | Slonczewski | |
| 5,734,605 A | 3/1998 | Zhu | |
| 5,991,193 A | 11/1999 | Gallagher | |
| 6,130,835 A | 10/2000 | Scheuerlein | |
| 6,169,686 B1 | 1/2001 | Brug | |
| 6,256,223 B1 | 7/2001 | Sun | |
| 6,331,944 B1 | 12/2001 | Monsma | |
| 6,385,082 B1 | 5/2002 | Abraham | |
| 6,714,444 B2 | 3/2004 | Huai | |
| 6,798,689 B2 | 9/2004 | Muller | |
| 6,873,544 B2 | 3/2005 | Perner | |

(Continued)

FOREIGN PATENT DOCUMENTS

| | | |
|---|---|---|
| EP | 1248265 | 10/2002 |
| EP | 1296331 | 3/2003 |
| EP | 1321943 | 6/2003 |

OTHER PUBLICATIONS

S. Yuasa et al., Spin-Polarized Resonant Tunneling in Magnetic Tunnel Junctions, Science 297, 234 (2002).

(Continued)

*Primary Examiner* — Harry W Byrne
(74) *Attorney, Agent, or Firm* — Mueting Raasch & Gebhardt PA (57) ABSTRACT

A memory unit includes a magnetic tunnel junction data cell electrically coupled to a bit line and a word line. The magnetic tunnel junction data cell is configured to switch between a high resistance state and a low resistance state by passing a unipolar voltage across the magnetic tunnel junction data cell. A diode is electrically coupled between the magnetic tunnel junction data cell and the word line or bit line. A voltage source provides the unipolar voltage across the magnetic tunnel junction data cell that writes the high resistance state and the low resistance state.

9 Claims, 7 Drawing Sheets

(56) References Cited

U.S. PATENT DOCUMENTS

| | | |
|---|---|---|
| 6,925,000 B2 | 8/2005 | Sussner |
| 6,977,838 B1 | 12/2005 | Tsang |
| 6,982,916 B2 | 1/2006 | Tsang |
| 7,009,877 B1 | 3/2006 | Huai |
| 7,031,178 B2 | 4/2006 | Parkin |
| 7,098,494 B2 | 8/2006 | Pakala |
| 7,187,577 B1 | 3/2007 | Wang |
| 7,218,550 B2 | 5/2007 | Schwabe |
| 7,224,601 B2 | 5/2007 | Panchula |
| 7,230,844 B2 | 6/2007 | Deak |
| 7,272,034 B1 | 9/2007 | Chen |
| 7,272,035 B1 | 9/2007 | Chen |
| 7,282,755 B2 | 10/2007 | Pakala |
| 7,286,395 B2 | 10/2007 | Chen |
| 7,289,356 B2 | 10/2007 | Diao |
| 7,345,912 B2 | 3/2008 | Luo |
| 7,369,427 B2 | 5/2008 | Diao |
| 7,379,327 B2 | 5/2008 | Chen |
| 7,382,664 B2 | 6/2008 | Le Phan |
| 7,394,684 B2 | 7/2008 | Inokuchi |
| 7,489,541 B2 | 2/2009 | Pakala |
| 7,502,249 B1 | 3/2009 | Ding |
| 7,515,457 B2 | 4/2009 | Chen |
| 7,596,015 B2* | 9/2009 | Kitagawa et al. ............ 365/158 |
| 7,768,824 B2 | 8/2010 | Yoshikawa |
| 2002/0136047 A1 | 9/2002 | Scheuerlein |
| 2002/0186582 A1 | 12/2002 | Sharma |
| 2003/0007398 A1* | 1/2003 | Daughton et al. ............ 365/200 |
| 2003/0168684 A1 | 9/2003 | Pan |
| 2004/0061154 A1* | 4/2004 | Huai et al. .................... 257/295 |
| 2006/0018057 A1* | 1/2006 | Huai ............................. 360/324.2 |
| 2006/0209600 A1 | 9/2006 | Le Phan |
| 2007/0019337 A1* | 1/2007 | Apalkov et al. ............ 360/324.1 |
| 2007/0085068 A1 | 4/2007 | Apalkov |
| 2007/0096229 A1* | 5/2007 | Yoshikawa et al. ........... 257/421 |
| 2007/0105241 A1 | 5/2007 | Leuschner |
| 2007/0246787 A1 | 10/2007 | Wang |
| 2007/0297220 A1* | 12/2007 | Yoshikawa et al. ........... 365/158 |
| 2008/0117553 A1 | 5/2008 | Carey |
| 2008/0144355 A1 | 6/2008 | Boeve |
| 2008/0164547 A1* | 7/2008 | Higo et al. .................... 257/421 |
| 2008/0197431 A1 | 8/2008 | Morise |
| 2008/0205125 A1 | 8/2008 | Kajiyama |
| 2008/0225583 A1* | 9/2008 | Guo et al. ..................... 365/173 |
| 2008/0258247 A1* | 10/2008 | Mancoff et al. ............... 257/421 |
| 2008/0273380 A1 | 11/2008 | Diao |
| 2008/0310213 A1 | 12/2008 | Chen |
| 2008/0310214 A1* | 12/2008 | Wang et al. ................... 365/158 |
| 2008/0310219 A1 | 12/2008 | Chen |
| 2009/0015958 A1* | 1/2009 | Nakamura et al. ............. 360/55 |
| 2009/0027810 A1* | 1/2009 | Horng et al. ............... 360/324.2 |
| 2009/0040855 A1 | 2/2009 | Luo |
| 2009/0050991 A1 | 2/2009 | Nagai |
| 2009/0185410 A1 | 7/2009 | Huai |
| 2009/0302403 A1 | 12/2009 | Nguyen |
| 2010/0007344 A1 | 1/2010 | Guo |

OTHER PUBLICATIONS

Sharma et al., Inversion of Spin Polarization and Tunneling Magnetoresistance in Spin-Dependent Tunneling Junctions, Physical Review Letters, vol. 82, No. 3, Jan. 18, 1999.

P. LeClair et al., Sign Reversal of Spin Polarization in Co/Ru/Al$_2$O$_3$/Co Magnetic Tunnel Junctions, Physical Review B, vol. 64, 100406(R).

Fei-fei Li, et al., Bias Dependence and Inversion of the Tunneling Magnetoresistance in Ferromagnetic Junctions, Physical Review B 69, 054410 (2004).

Akerman et al., Reliability of 3MBIT MRAM, Annual Int'l Reliability Physics Symposium, San Jose, 2005, pp. 163-167.

Valenzuela et al., Spin Polarized Tunneling at Finite Bias, Physical Review Letters, PRL 94, 196601 (2005).

Akerman, Toward a Universal Memory, Science, vol. 308, Apr. 22, 2005.

Agilent 81140A Series 81141A/81142A Serial Pulse Data Generators 7GHz and 13.5 GHz, Data Sheet, Version 1.1.

Hosomi et al., Electron Devices Meeting, 2005, IEDM Technical Digest, IEEE International, pp. 459-462.

Kawahara et al., Spin-Transfer Torque RAM (SPRAM) with Bit-by-Bit Bidirectional Current Write and Parallelizing-Direction Current Read, ISSCC 07, San Francisco, Feb. 2007.

Lee et al., in 2 Stack 1D-1R Cross Point Structure with Oxide Diodes as Switch Elements in High Density Resistance RAM Applications, IEDM 2007.

M. Nakayama et al., JAP 103, 07A710 (2008).

Numata, T. Suzuki, N. Ohshima, S. Fukami, K. Nagahara, N. Ishiwata, and N. Kasai, Scalable Cell Technology Utilizing Domain Wall Motion for High Speed MRAM, T12B-4, Symposium on VLSI Technology, Japan 2007.

Ozatay et al., Spin Transfer by Nonuniform Current Injection Into a Nanomagnet, Applied Physics Letters 88, 202502 (2006).

Slonczewski, J.C., Current-Driven Excitation of Magnetic Multilayers, Journal of Magnetism and Magnetic Materials 159 (1996) L1-L7.

Slonczweski, J.C., PRB, vol. 39, 10, p. 6995 (1989).

Sun J.C. et al., APL 90, 121128 (2007).

U.S. Appl. No. 12/234,929, filed Sep. 22, 2008, Inventors: Xi.

U.S. Appl. No. 12/415,243, filed Mar. 31, 2009, Inventors: Dimitrov.

U.S. Appl. No. 12/415,257, filed Mar. 31, 2009; Inventors: Dimitrov.

Waintal, et al., Role of Spin-Dependent Interface Scattering in Generating Current-Induced Torques in Magnetic Multilayers, Phy. Rev. B, vol. 62, 12317 (2000).

\* cited by examiner

UNIPOLAR SPIN-TRANSFER SWITCHING MEMORY UNIT

RELATED APPLICATION

This application is a divisional application of U.S. application Ser. No. 12/175,545 filed Jul. 18, 2008. The entire disclosure is incorporated herein by reference.

BACKGROUND

Fast growth of the pervasive computing and handheld/communication industry generates exploding demand for high capacity nonvolatile solid-state data storage devices. It is believed that nonvolatile memories, especially flash memory, will replace DRAM to occupy the biggest share of memory market by 2009. However, flash memory has several drawbacks such as slow access speed (~ms write and ~50-100 ns read), limited endurance (~$10^3$-$10^4$ programming cycles), and the integration difficulty in system-on-chip (SoC). Flash memory (NAND or NOR) also faces significant scaling problems at 32 nm node and beyond.

Magneto-resistive Random Access Memory (MRAM) is another promising candidate for future nonvolatile and universal memory. MRAM features non-volatility, fast writing/reading speed (<10 ns), almost unlimited programming endurance (>$10^{15}$ cycles) and zero standby power. The basic component of MRAM is a magnetic tunneling junction (MTJ). Data storage is realized by switching the resistance of MTJ between a high-resistance state and a low-resistance state. MRAM switches the MTJ resistance by using a current induced magnetic field to switch the magnetization of MTJ. As the MTJ size shrinks, the switching magnetic field amplitude increases and the switching variation becomes severer. Hence, the incurred high power consumption limits the scaling of conventional MRAM.

Recently, a new write mechanism, which is based upon spin polarization current induced magnetization switching, was introduced to the MRAM design. This new MRAM design, called Spin-Transfer Torque RAM (STRAM), uses a (bidirectional) current through the MTJ to realize the resistance switching. Therefore, the switching mechanism of STRAM is constrained locally and STRAM is believed to have a better scaling property than the conventional MRAM.

However, a number of yield-limiting factors must be overcome before STRAM enters the production stage. A positive current (i.e., electrons flow from the pinned layer to the free layer of the MTJ) must be used to program the cell into the low resistance mode. On the other hand, a negative current (i.e., electrons flow from the free layer to the pinned layer of the MTJ) is necessary to switch the magnetization state back to antiparallel (high resistance mode). Because of the requirement of a bipolar current in the write mode, a metal-oxide-semiconductor field effect transistor (MOSFET) is needed in the memory cell design. Due to the large critical switching current, the lateral size of MOSFET needs to be large to provide enough drive current, which causes problems in scaling and is a barrier for higher density integration. Furthermore, this design requires three contact terminals: a bit line, a gate contact (or word line), and a source contact.

BRIEF SUMMARY

The present disclosure relates to spin-transfer torque memory. In particular, present disclosure relates to unipolar spin transfer switching of a spin-transfer torque memory unit. Unipolar spin transfer switching enables a one diode one magnetic tunnel junction design described herein.

One illustrative memory unit includes a magnetic tunnel junction data cell electrically coupled to a bit line and a word line. The magnetic tunnel junction data cell is configured to switch between a high resistance state and a low resistance state by passing a unipolar voltage across the magnetic tunnel junction data cell. A diode is electrically coupled between the magnetic tunnel junction data cell and the word line or bit line. A voltage source provides the unipolar voltage across the magnetic tunnel junction data cell that writes both the high resistance state and the low resistance state.

An illustrative spin-transfer torque memory unit includes a spin-transfer torque memory unit including a bit line, a word line, and a magnetic tunnel junction data cell electrically coupled to the bit line and the word line. The magnetic tunnel junction data cell is configured to switch between a high resistance state and a low resistance state by passing a unipolar forward bias voltage pulse through the magnetic tunnel junction data cell. A diode is electrically coupled between the magnetic tunnel junction data cell and the word line or bit line. A voltage source provides the unipolar forward bias voltage pulse across the magnetic tunnel junction data cell that writes the high resistance state and the low resistance state.

An illustrative method includes switching a magnetic tunnel junction data cell from a low resistance state to a high resistance state by passing a first forward bias voltage pulse having a first polarity through the magnetic tunnel junction data cell and a diode. Then the method includes switching the magnetic tunnel junction data cell from the high resistance state to the low resistance state by passing a second forward bias voltage pulse having the first polarity through the magnetic tunnel junction data cell.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to spin-transfer torque memory. In particular, present disclosure relates to unipolar spin transfer switching of a spin-transfer torque memory unit. Unipolar spin transfer switching enables a one diode one magnetic tunnel junction design described herein. The present disclosure relates to bias dependent sign change of tunneling magnetoresistance (TMR) of tunneling magnetic junctions (MTJ) fabricated using various types of materials is discussed. TMR sign change of these MTJs indicates a sign change of tunneling spin polarization across the tunnel barriers. This property can be used to realize unipolar spin transfer switching for spin transfer random access memory (ST-RAM) technology. While the present disclosure is not so limited, an appreciation of various aspects of the disclosure will be gained through a discussion of the examples provided below.

Figure 1:
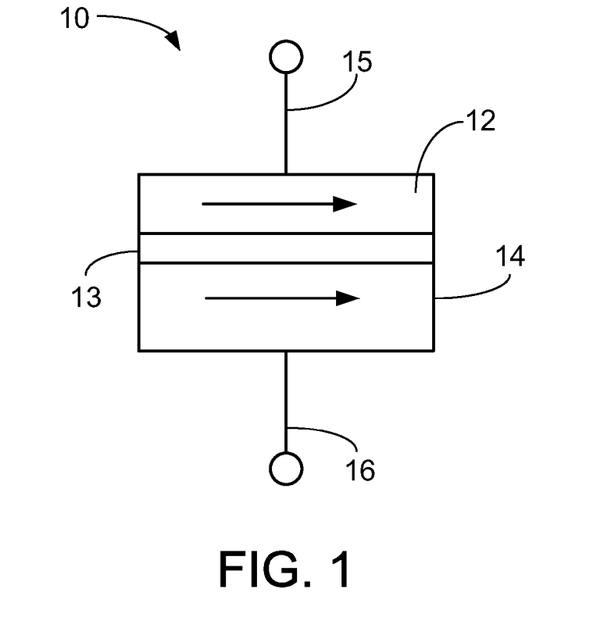
FIG. 1 is a cross-sectional schematic diagram of an illustrative magnetic tunnel junction memory cell in the low resistance state.
Figure 2:
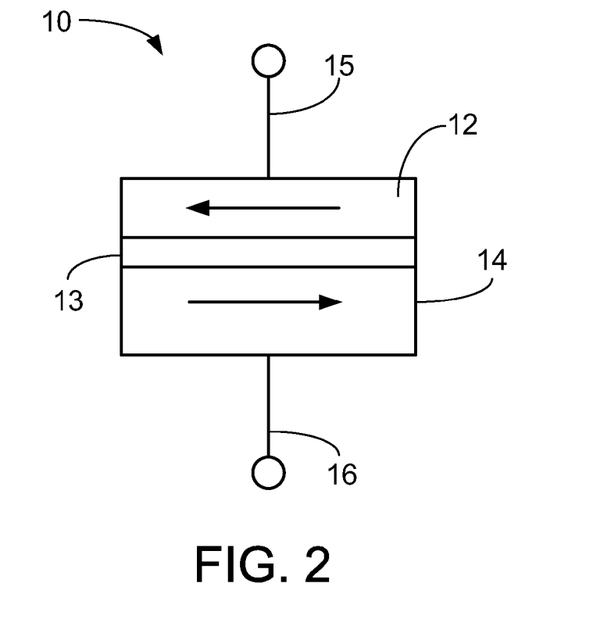
FIG. 2 is a cross-sectional schematic diagram of another magnetic tunnel junction memory cell in the high resistance state.

FIG. 1 is a cross-sectional schematic diagram of an illustrative magnetic tunnel junction data cell 10 in the low resistance state and FIG. 2 is a cross-sectional schematic diagram of another magnetic tunnel junction data cell 10 in the high resistance state. The magnetic tunnel junction data cell 10 includes a ferromagnetic free layer 12 and a ferromagnetic reference (i.e., pinned) layer 14. The ferromagnetic free layer 12 and a ferromagnetic reference layer 14 are separated by an oxide barrier layer 13 or tunnel barrier. A first electrode 15 is in electrical contact with the ferromagnetic free layer 12 and a second electrode 16 is in electrical contact with the ferromagnetic reference layer 14. The ferromagnetic layers 12, 14 may be made of any useful ferromagnetic (FM) alloys such as, for example, Fe, Co, Ni and the insulating barrier layer 13 may be made of an electrically insulating material such as, for example an oxide material (e.g., $Al_2O_3$ or MgO). Other suitable materials may also be used.

In some embodiments the magnetic tunnel junction data cell 10 the oxide barrier layer 13 includes $Ta_2O_5$ and the ferromagnetic free layer 12 and a ferromagnetic pinned layer 14 include NiFe, CoFe, or Co. The oxide barrier layer 13 has a thickness in a range from 0.5 to 1 nanometer. In many of theses embodiments, a first resistance state switching voltage across the magnetic tunnel junction data cell 10 can be 0.5±0.1V and a second resistance state switching voltage across the magnetic tunnel junction data cell 10 can be 1.3±0.1V. As discussed below the first resistance state switching voltage and the second resistance state switching voltage have the same forward bias polarity.

In some embodiments the magnetic tunnel junction data cell 10 the tunnel barrier layer 13 includes GaAs and the ferromagnetic free layer 12 and a ferromagnetic pinned layer 14 include Fe. The tunnel barrier layer 13 has a thickness in a range from 5 to 15 nanometers. In many of theses embodiments, a first resistance state switching voltage across the magnetic tunnel junction data cell 10 can be 0.25±0.05V and a second resistance state switching voltage across the magnetic tunnel junction data cell 10 can be 0.75±0.05V. As discussed below the first resistance state switching voltage and the second resistance state switching voltage have the same forward bias polarity.

In some embodiments the magnetic tunnel junction data cell 10 the oxide barrier layer 13 includes $Al_2O_3$ and the ferromagnetic free layer 12 and a ferromagnetic pinned layer 14 include NiFe, CoFe, or Co. The oxide barrier layer 13 has a thickness in a range a few nanometers. In many of theses embodiments, a first resistance state switching voltage across the magnetic tunnel junction data cell 10 can be 0.3±0.1V and a second resistance state switching voltage across the magnetic tunnel junction data cell 10 can be 0.8±0.1V. As discussed below the first resistance state switching voltage and the second resistance state switching voltage have the same forward bias polarity.

The electrodes 15, 16 electrically connect the ferromagnetic layers 12, 14 to a control circuit providing read and write currents through the ferromagnetic layers 12, 14. The resistance across the magnetic tunnel junction data cell 10 is determined by the relative orientation of the magnetization vectors or magnetization orientations of the ferromagnetic layers 12, 14. The magnetization direction of the ferromagnetic reference layer 14 is pinned in a predetermined direction while the magnetization direction of the ferromagnetic free layer 12 is free to rotate under the influence of a spin torque. Pinning of the ferromagnetic reference layer 14 may be achieved through, e.g., the use of exchange bias with an antiferromagnetically ordered material such as PtMn, IrMn and others.

FIG. 1 illustrates the magnetic tunnel junction data cell 10 in the low resistance state where the magnetization orientation of the ferromagnetic free layer 12 is parallel and in the same direction of the magnetization orientation of the ferromagnetic reference layer 14. This is termed the low resistance state or "0" data state. FIG. 2 illustrates the magnetic tunnel junction data cell 10 in the high resistance state where the magnetization orientation of the ferromagnetic free layer 12 is anti-parallel and in the opposite direction of the magnetization orientation of the ferromagnetic reference layer 14. This is termed the high resistance state or "1" data state.

Switching the resistance state and hence the data state of the magnetic tunnel junction data cell 10 via spin-transfer occurs when a current, passing through a magnetic layer of the magnetic tunnel junction data cell 10, becomes spin polarized and imparts a spin torque on the free layer 12 of the magnetic tunnel junction data cell 10. When a sufficient spin torque is applied to the free layer 12, the magnetization orientation of the free layer 12 can be switched between two opposite directions and accordingly the magnetic tunnel junction data cell 10 can be switched between the parallel state (i.e., low resistance state or "0" data state) and anti-parallel state (i.e., high resistance state or "1" data state) depending on the magnitude of the unipolar polarized write current, as described herein.

The illustrative spin-transfer torque magnetic tunnel junction data cell 10 may be used to construct a memory device that includes multiple magnetic tunnel junction data cell where a data bit is stored in magnetic tunnel junction data cell by changing the relative magnetization state of the free magnetic layer 12 with respect to the pinned magnetic layer 14. The stored data bit can be read out by measuring the resistance of the cell which changes with the magnetization direction of the free layer relative to the pinned magnetic layer. In order for the spin-transfer torque magnetic tunnel junction data cell 10 to have the characteristics of a non-volatile random access memory, the free layer exhibits thermal stability against random fluctuations so that the orientation of the free layer is changed only when it is controlled to make such a change. This thermal stability can be achieved via the magnetic anisotropy using different methods, e.g., varying the bit size, shape, and crystalline anisotropy. Additional anisotropy can be obtained through magnetic coupling to other magnetic layers either through exchange or magnetic fields. Generally, the anisotropy causes a soft and hard axis to form in thin magnetic layers. The hard and soft axes are defined by the magnitude of the external energy, usually in the form of a magnetic field, needed to fully rotate (saturate) the direction of the magnetization in that direction, with the hard axis requiring a higher saturation magnetic field.

Figure 3:
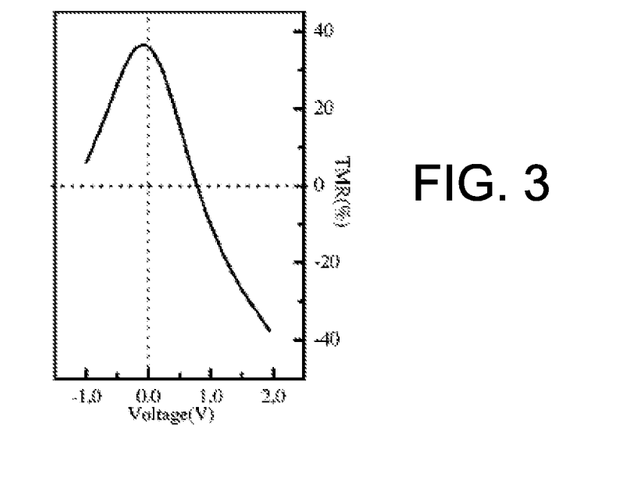
FIG. 3 is a graph of a Tunneling Magneto Resistance Ratio (TMR) verses voltage bias curve of a magnetic tunnel junction (MTJ) data cell described herein.

FIG. 3 is a graph of a Tunneling Magneto Resistance Ratio (TMR) verses voltage bias curve of a magnetic tunnel junction (MTJ) data cell described herein. Assuming a spin independent tunneling efficiency and that the spin polarization at the Fermi level for ferromagnetic free layer 12 and a ferromagnetic reference layer 14 are P1 and P2 respectively, TMR of such MTJ can be expressed as: $TMR=P1*P2/(1-P1*P2)$. Generally speaking, spin polarization of conventional ferromagnetic materials has weak energy dependence near the Fermi level, resulting in a weak dependence of TMR on the bias voltage across the MTJ. However, if the magnetic leads of a MTJ are ferromagnetic materials whose density of states changes abruptly at the Fermi level, TMR of such MTJ can have strong bias dependence. A bias dependent sign change of TMR is possible, as shown in FIG. 3. This figure shows that a TMR change from 20% at 0.4 V to −30% at 1.5 V. Such a high TMR is sufficient for spin transfer switching, as observed in an MTJ with constructions described above. This figures illustrated the possibility of unipolar spin transfer switching using an MTJ with constructions described above.

Figure 4A:
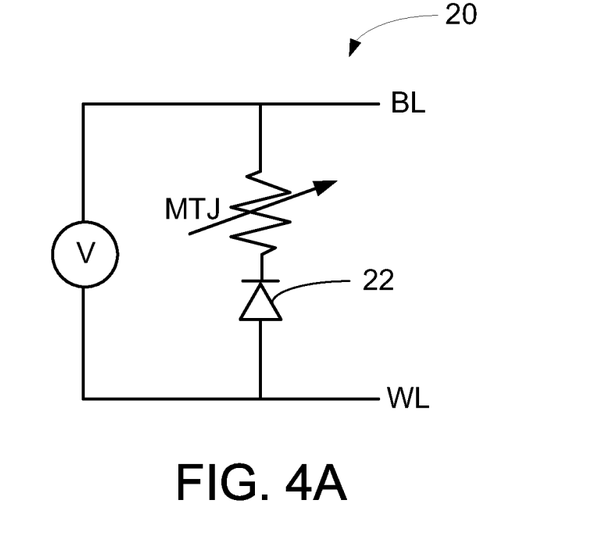
FIGS. 4A and 4B are schematic circuit diagrams of a memory unit.
Figure 4B:
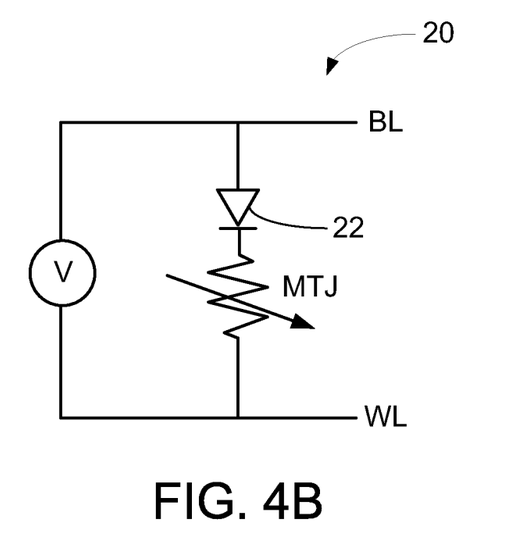

FIGS. 4A and 4B are schematic circuit diagrams of a memory unit 20. The memory unit 20 includes a magnetic tunnel junction data cell MTJ electrically coupled to a bit line BL and a word line WL. The magnetic tunnel junction data cell MTJ is configured to switch between a high resistance state and a low resistance state by passing a unipolar voltage through the magnetic tunnel junction data cell MTJ. A diode 22 is electrically between the magnetic tunnel junction data cell MTJ and the word line WL. In other embodiments, the diode 22 is electrically coupled between the magnetic tunnel junction data cell MTJ and the bit line BL, as illustrated in FIG. 4B. A voltage source V provides the unipolar voltage across the magnetic tunnel junction data cell MTJ to write the high resistance state and the low resistance state.

A diode allows an electric current to pass in one direction (referred to herein as the forward biased condition or "forward bias") and to block electrical current it in the opposite direction (the reverse biased condition or "reverse bias"). Thus, the diode can be thought of as an electronic version of a check valve.

In many embodiments, the voltage source V is a voltage pulse generator that is capable of generating a unipolar voltage pulse through the magnetic tunnel junction data cell MTJ. In many embodiments, the voltage source V is a voltage pulse generator that is capable of generating a unipolar forward bias voltage pulse through the magnetic tunnel junction data cell MTJ. The unipolar forward bias voltage pulse passes through the diode 22 in only the forward bias direction of the diode 22.

Figure 4C:
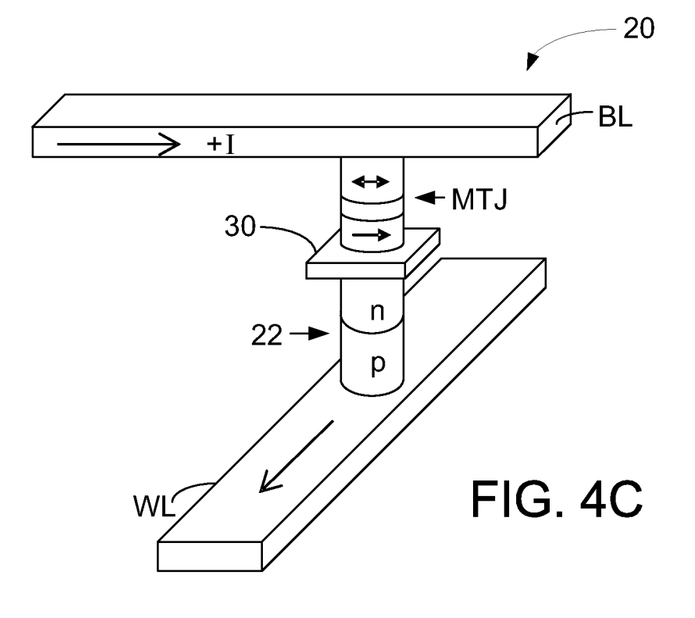
FIG. 4C is a perspective view schematic diagram of an illustrative memory unit.

FIG. 4C is a perspective view schematic diagram of an illustrative memory unit 20. The memory unit 20 includes a magnetic tunnel junction data cell MTJ electrically coupled to a bit line BL and a word line WL. In the illustrated embodiment, the bit line BL and a word line WL are orthogonal to each other and form a cross-point where the diode 22 and the MTJ are located therebetween. The magnetic tunnel junction data cell MTJ is configured to switch between a high resistance state and a low resistance state by passing a unipolar voltage through the magnetic tunnel junction data cell MTJ. As illustrated, the magnetic tunnel junction data cell MTJ includes a free layer (double arrow layer) and a pinned layer (single arrow layer) spaced apart by an oxide barrier layer, as described above. A diode 22 is electrically between the magnetic tunnel junction data cell MTJ and the word line WL. In other embodiments, the diode 22 is electrically coupled between the magnetic tunnel junction data cell MTJ and the bit line BL, as illustrated in FIG. 4B. A connecting layer 30 is illustrated between the magnetic tunnel junction data cell MTJ and the diode 22. The connecting layer 30 can be an electrically conducting and nonmagnetic layer. A voltage source (not shown) provides the unipolar voltage across the magnetic tunnel junction data cell MTJ to write both the high resistance state and the low resistance state.

Figure 5:
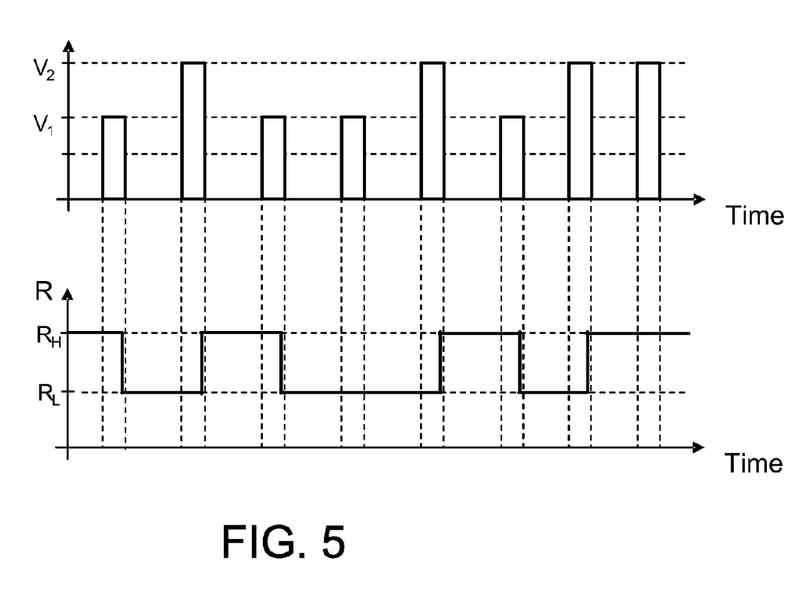
FIG. 5 is a graph of unipolar voltage pulses and the corresponding resistance state change of the MTJ verses time.

FIG. 5 is a graph of unipolar voltage pulses and the corresponding resistance state change of the MTJ verses time. The lower scale represents the resistance state of the MTJ. The high resistance state is denoted as $R_H$ and the low resistance state is denoted as $R_L$. The upper scale represents the unipolar forward bias voltage pulses through the magnetic tunnel junction data cell MTJ where $V_1$ denotes a voltage pulse magnitude and $V_2$ denoted a voltage pulse having a greater magnitude. In many embodiments the second voltage pulse $V_2$ magnitude is in a range from 2 to 4 times greater than the first voltage pulse magnitude $V_1$. In some embodiments, the second voltage pulse $V_2$ magnitude is in a range from 2.5 to 3.5 times greater than the first voltage pulse magnitude $V_1$. The dotted lines between the upper scale and the lower scale indicate the relative timing of the unipolar forward bias voltage pulse and the corresponding change in the resistance state of the MTJ. For example, a unipolar forward bias voltage pulse of $V_1$ switches the resistance of the MTJ from $R_H$ to $R_L$. Likewise, a unipolar forward bias voltage pulse of $V_2$ switches the resistance of the MTJ from $R_L$ to $R_H$.

Figure 6:
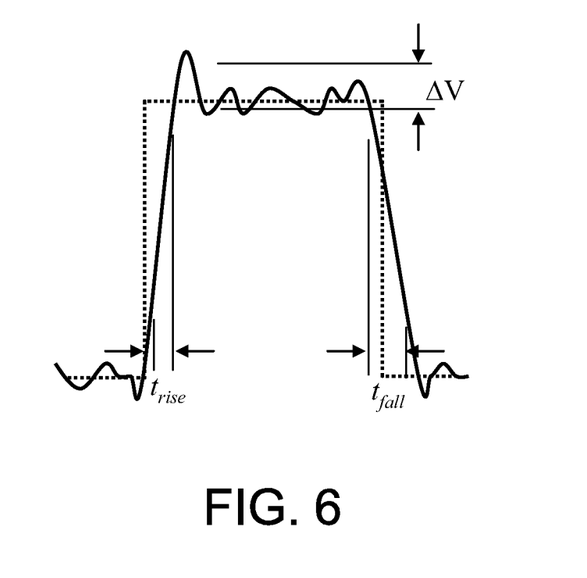
FIG. 6 is a graph of a voltage pulse generated from a voltage pulse generator.

FIG. 6 is a graph of a voltage pulse generated from a voltage pulse generator. The voltage pulse includes a voltage rise transition duration $t_{rise}$ and a voltage fall transition duration $t_{fall}$ and a voltage plateau region duration. The voltage rise transition duration $t_{rise}$ and a voltage fall transition duration $t_{fall}$ have an influence on the effectiveness of the unipolar spin transfer switching of the MTJ since the larger voltage pulse $V_2$ passes through the smaller voltage pulse lever $V_1$ twice. In many embodiments, the voltage rise transition duration $t_{rise}$ and a voltage fall transition duration $t_{fall}$ are each less than 30 picoseconds, or less than 25 picoseconds, or less than 20 picoseconds. The voltage plateau region duration can be any useful duration. In many embodiments, the voltage plateau region duration is in a range from 0.25 to 50 nanoseconds, or from 0.5 nanoseconds to 15 nanoseconds. In many embodiments the pulse amplitude fluctuation $\Delta V$ is in a range from 0.05V to 0.2V or from 0.05 to 0.1V. One example of a pulse generator capable of providing the described pulses is commercially available from Agilent under the trade designation 81140A Series such as the 81141A or 81142A Serial Pulse Data Generators 7 GHz and 13.5 GHz.

Figure 7:
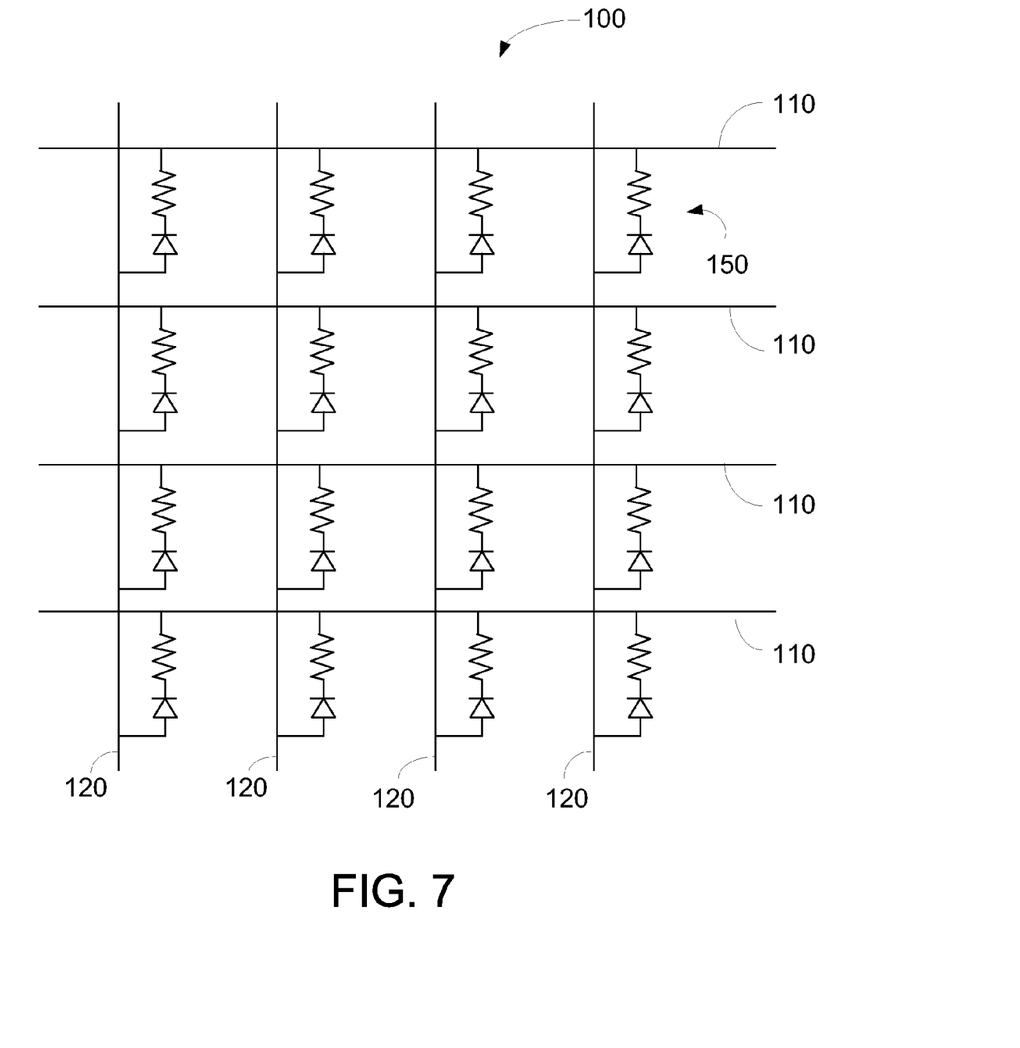
FIG. 7 is a schematic circuit diagram of an illustrative memory array.

FIG. 7 is a schematic circuit diagram of an illustrative memory array 100. A plurality of memory units 150, described herein can be arranged in an array to form the memory array 100. The memory array 100 includes a number of parallel conductive bit lines 110. The memory array 100 includes a number of parallel conductive word lines 120 that are generally orthogonal to the bit lines 110. The word lines 120 and bit lines 110 form a cross-point array where a memory unit 150 is disposed at each cross-point. The memory unit 150 and memory array 100 can be formed using conventional semiconductor fabrication techniques.

Figure 8:
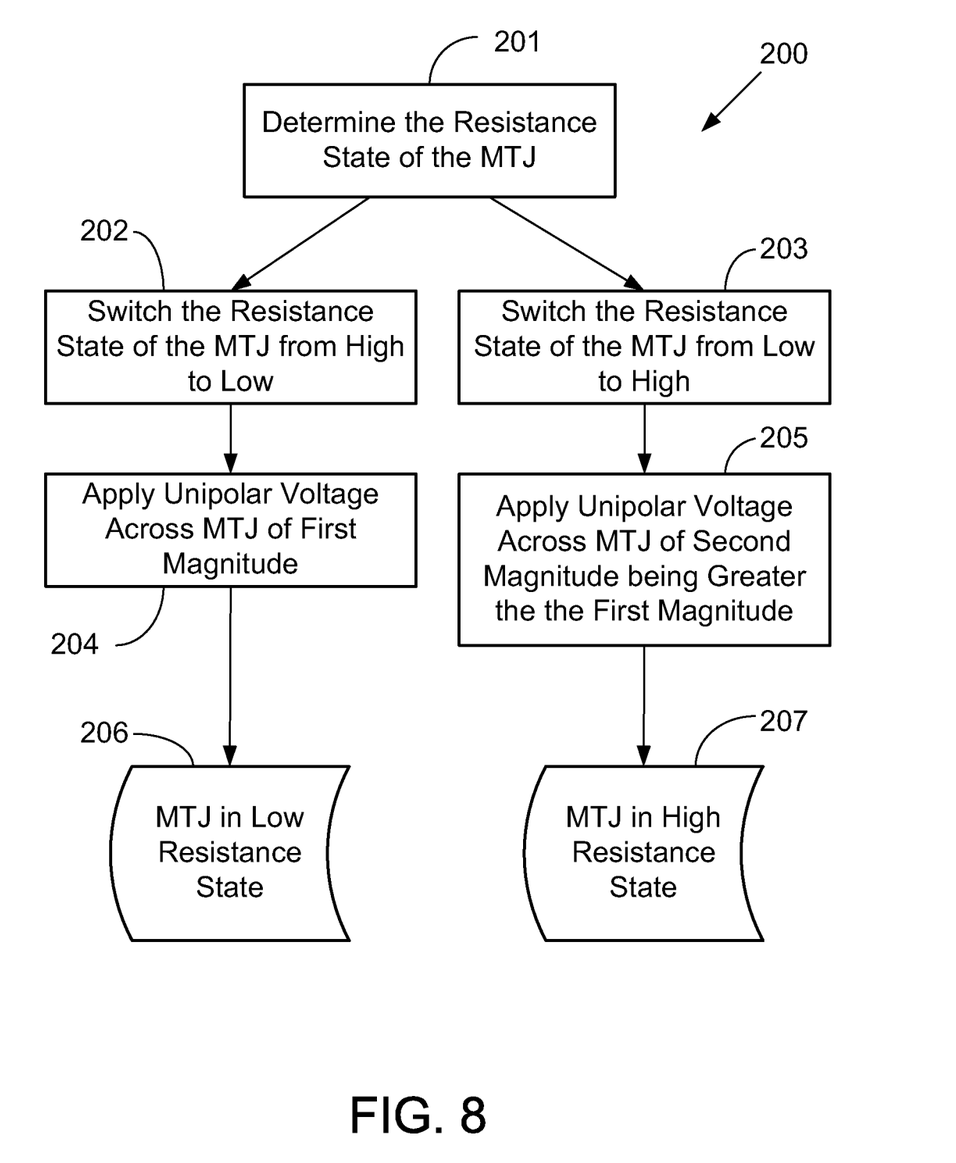
FIG. 8 is a flowchart illustrating a method of switching a magnetic tunnel junction data cell.

FIG. 8 is a flowchart illustrating a method of switching a magnetic tunnel junction data cell 200. The method includes a step 201 of determining the resistance state of the MTJ memory unit (described above). Step 202 provides for switching the MTJ data cell from a high resistance state to a low resistance state by passing a first forward bias voltage pulse having a first polarity through a diode and the magnetic tunnel junction data cell. At block 204, the first forward bias voltage pulse has a first magnitude. Then the magnetic tunnel junction data cell is in the low resistance state data state 206.

Step 203 provides for switching the magnetic tunnel junction data cell from the low resistance state to the high resistance state by passing a second forward bias voltage pulse having the first polarity through the diode and the magnetic tunnel junction data cell. At block 205, the second forward bias voltage pulse has a second magnitude being greater than the first magnitude, as described above. Then the magnetic tunnel junction data cell is in the high resistance state data state 207.

Thus, embodiments of the UNIPOLAR SPIN-TRANSFER SWITCHING MEMORY
UNIT are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A spin-transfer torque memory unit comprising:
   a bit line;
   a word line;
   a magnetic tunnel junction data cell electrically coupled to the bit line and the word line, the magnetic tunnel junction data cell is configured to switch between a high resistance state and a low resistance state by passing a unipolar forward bias voltage pulse across the magnetic tunnel junction data cell;
   a diode electrically coupled between the magnetic tunnel junction data cell and the word line or bit line; and
   a voltage source providing the unipolar forward bias voltage pulse across the magnetic tunnel junction data cell that writes the high resistance state and the low resistance state.

2. A spin-transfer torque memory unit according to claim 1, wherein the diode is a p-n diode.

3. A spin-transfer torque memory unit according to claim 1, wherein the unipolar forward bias voltage pulse has a first magnitude to switch the magnetic tunnel junction data cell from a high resistance state to a low resistance state, and a second magnitude to switch the magnetic tunnel junction data cell from a low resistance state to a high resistance state, and the second magnitude is in a range from 2 to 4 times greater than the first magnitude.

4. A spin-transfer torque memory unit according to claim 3, wherein the first and second magnitude unipolar forward bias voltage pulse has voltage rise transition duration and a voltage fall transition duration that is less than 30 picoseconds and a voltage plateau region duration in a range from 0.5 nanoseconds to 15 nanoseconds.

5. A spin-transfer torque memory unit according to claim 3, wherein the magnetic tunnel junction data cell comprises an tunnel barrier layer between a ferromagnetic free layer and a ferromagnetic pinned layer.

6. A spin-transfer torque memory unit according to claim 3, wherein the tunnel barrier layer comprises $Ta_2O_5$ and the ferromagnetic free layer and a ferromagnetic pinned layer comprising NiFe, CoFe, or Co.

7. A spin-transfer torque memory unit according to claim 3, wherein the tunnel_barrier layer comprising $Al_2O_3$ and the ferromagnetic free layer and a ferromagnetic pinned layer comprising NiFe or CoFe.

8. A spin-transfer torque memory unit according to claim 3, wherein tunnel barrier layer comprising GaAs and the ferromagnetic free layer and a ferromagnetic pinned layer comprising Fe.

9. A spin transfer torque memory unit according to claim 1, wherein the magnetic tunnel junction data cell has a TMR % range of at least +20 to −30 for a forward bias voltage range from 0.4 to 1.5 volts.

* * * * *